(12) United States Patent
Seitz et al.

(10) Patent No.: US 8,496,851 B2
(45) Date of Patent: Jul. 30, 2013

(54) SCINTILLATION MATERIALS IN SINGLE CRYSTALLINE, POLYCRYSTALLINE AND CERAMIC FORM

(76) Inventors: Christoph Seitz, Jena (DE); Johann-Christoph Von Saldern, Jena (DE); Tilo Aichele, Jena (DE)

( * ) Notice: Subject to any disclaimer, the term of this patent is extended or adjusted under 35 U.S.C. 154(b) by 187 days.

(21) Appl. No.: 12/859,906

(22) Filed: Aug. 20, 2010

(65) Prior Publication Data

US 2011/0042616 A1   Feb. 24, 2011

(30) Foreign Application Priority Data

Aug. 24, 2009 (DE) .................. 10 2009 028 842

(51) Int. Cl.
    *C09K 11/08* (2006.01)
    *C09K 11/61* (2006.01)
(52) U.S. Cl.
    USPC .................................................. 252/301.4 H
(58) Field of Classification Search
    USPC .............. 252/301.4 H, 361 R; 250/370.11, 250/390.11
    See application file for complete search history.

(56) References Cited

U.S. PATENT DOCUMENTS

| 6,436,313 | B1 * | 8/2002 | Srivastava et al. ...... 252/301.4 P |
| 6,445,765 | B1 | 9/2002 | Frank et al. |
| 7,067,816 | B2 | 6/2006 | Dorenbos et al. |
| 7,084,403 | B2 | 8/2006 | Srivastava et al. |
| 7,608,201 | B2 * | 10/2009 | Iltis ........................ 252/301.4 H |
| 2007/0090328 | A1 * | 4/2007 | Dorenbos et al. ...... 252/301.4 H |
| 2007/0241284 | A1 | 10/2007 | Iltis |
| 2009/0166585 | A1 * | 7/2009 | Bourret-Courchesne et al. ........................ 252/301.4 H |

FOREIGN PATENT DOCUMENTS

EP   1 186 909          3/2002
WO   WO 2005103760 A1 *  11/2005

OTHER PUBLICATIONS

Yu Pei et al: "Growth and Luminescence Characteristics . . . " Journal of Crystal Growth 279, 2005, pp. 390-393 (In English).

* cited by examiner

*Primary Examiner* — Emily Le
*Assistant Examiner* — Lynne Edmondson
(74) *Attorney, Agent, or Firm* — Hudak, Shunk & Farine Co. LPA

(57) ABSTRACT

The scintillation materials may exist in single crystalline, polycrystalline or ceramic form. Preferably, the scintillation materials are in single crystalline form. According to the present invention all cation-forming elements are present in the scintillation material in an amount, which is higher than stoichiometric (hyper- or over-stoichiometric) with respect to the anion-forming elements.

2 Claims, 1 Drawing Sheet

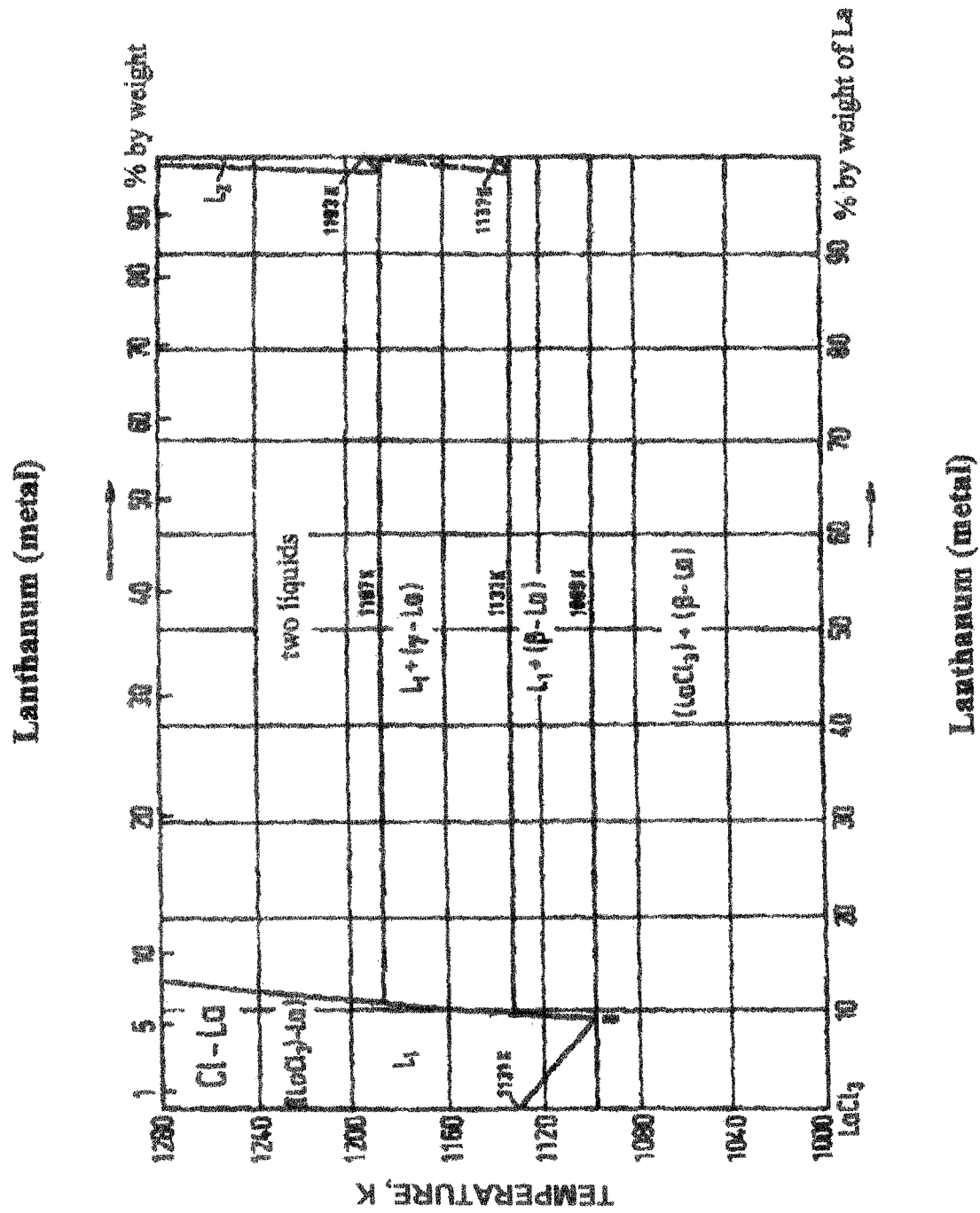

SCINTILLATION MATERIALS IN SINGLE CRYSTALLINE, POLYCRYSTALLINE AND CERAMIC FORM

CROSS-REFERENCE

The subject matter described and claimed herein below is also described in German Patent Application No. 10 2009 028 842.2, filed on Aug. 24, 2009 in Germany. This German Patent Application provides the basis for a claim of priority of invention for the invention described and claimed herein below under 35 U.S.C. 119 (a) (d).

BACKGROUND OF THE INVENTION

1. The Field of the Invention

The present invention relates to single crystalline, polycrystalline or ceramic scintillation materials having a higher strength due to their particular composition.

2. The Description of the Related Art

Scintillation materials are active media which absorb highly energetic radiation, wherein via numerous of intermediate steps electron-hole pairs are generated. In this case, the activator centers are energized into an excited state. Recombination results in emission of visible light.

Ranges of application are in the field of medicine (imaging and diagnostic), industrial inspection, dosimetry, nuclear medicine and high energy physics as well as "security", object tracking and exploration.

A known family of scintillator crystals is of the type of sodium iodide (NaI) doped with thallium. This scintillation material, which was discovered in the year 1948 from Robert Hofstadter and which is the basis of modern scintillators, is also today the ultimate in this field, despite 50 years of search for other materials. These crystals have a relatively long scintillation decay time.

A material which is also used is CsI which can be used in pure form or doped with thallium and sodium, respectively, depending on the intended purpose.

A family of scintillator crystals which has had a great development is of the type bismuth germanate. But these crystals have long decay times which limit their use to low counting rates.

A younger scintillator family was developed in the nineties and is of the type of lutetium oxyorthosilicate activated with cerium, LSO (Ce). However, these crystals are very heterogenic and have a very high melting point (about 2200° C.).

The development of new scintillator materials having improved properties is the subject matter of numerous studies, because the requirements for scintillator materials are extremely versatile.

The requirements for detector materials for the detection and conversion of highly energetic radiation (X-ray and gamma radiation) into visible light are diverse:
- high energy resolution
- fast decay time
- stopping power
- mechanical requirements for the material
- high light yield
- radiation stability
- homogeneity.

The higher the energy resolution, the better the quality of the detector. So it is estimated that an energy resolution of about 7% allows obtaining good results. Nevertheless, smaller resolution values are of good interest, because in these cases e.g. the contrast and the quality of images which can be provided by medical apparatuses are improved. This for example allows a more exact and earlier detection of tumours.

A very important parameter is the decay time of the scintillators. In this case, a decay time is desired which is as short as possible so that the operation frequency of the detectors can be increased. In the field of nuclear medicine imaging it allows for example a considerably shortened examination time.

Furthermore, a good stopping power of the detectors is desired. The stopping power characterizes the absorption properties of a material. The stopping power specifies how the energy of a particle decreases during the passage through the material. It is defined as the derivative of the energy with respect to the distance. A high electron density results in high interactions during which the gamma quanta are absorbed and result in scintillation. However, only those gamma quanta which are absorbed can produce light. For scintillator materials of the same thickness the quantum efficiency increases with the stopping power. In TOF-PET (time of flight-positron emission tomography) higher stopping power results in a lower thickness of the scintillator with the same intended quantum efficiency and as a result thereof an increased spatial resolution is achieved.

According to prior art lanthanoid halogenides are produced in exact stoichiometry according to a melt growth method, for example according to the Bridgman method, Czochralski method, vertical gradient freeze (VGF) method, horizontal gradient freeze (HGF) method or gradient solidification method (GSM).

In the Bridgman method an ampoule is used in which the melt and the crystal are contained. The ampoule containing the initially solid growth material is vertically moved upwards in the furnace so that the material melts top-down. At the bottom of the ampoule a monocrystalline seed crystal is contained. After this seed crystal has partly been melted, the ampoule is slowly pulled back so that the crystal grows from the bottom up starting at the seed crystal.

In the Czochralski method in a crucible which already contains the desired melt a slowly rotating metal rod on which the seed crystal is mounted is immersed from above into the melt with its tip. The crystal growing on the seed crystal is pulled upwards out of the melt.

In the so-called vertical gradient freeze method (VGF method) several concentric heating circuits which are superimposed upon each other are arranged around the stationary melting crucible in jacket form. Each of these heating circuits can be separately energized. By slowly decreasing the heat output of each single heating circuit arranged around the crucible wall the temperature can be slowly decreased below the crystallisation point, thus producing a radial temperature gradient along which the crystal growth takes place.

The horizontal gradient freeze method (HGF method) is conducted in an analogous way to the VGF method, only that the construction is tilted by 90°.

In the so-called gradient solidification method (GSM) around a stationary melting crucible annular circumambient heating circuits are slowly moved down and up.

Journal of Crystal Growth 279 (2005), pages 390 to 393 describes the examination of the crystal growth according to a modified Bridgman method of undoped large crystals of $LaCl_3$ having high quality and without defects. These large crystals of $LaCl_3$ can only be produced by removing water and oxygen during the production. But this is not a simple undertaking, because $LaCl_3$ has hygroscopic properties and during the process of crystal growth contamination may take place. At first, the raw material is heated in a nitrogen atmosphere to 235° C. for 10 h, to remove humidity and crystallized water. Subsequently, the dried powder is pressed and the crucible is sealed completely so that no contamination takes place. According to this document, defects in the crystal are avoided and crystals of $LaCl_3$ having high quality are obtained. However, the method is time-consuming and expensive.

US 2007/0241284 A1 discloses inorganic scintillation materials having the formula $A_nLn_pX_{(3*p+n)}$, wherein Ln represents one or more rare earth metals, X represents one or more halogen atoms, selected from F, Cl, Br or I, and A represents one or more alkali metals, such as K, Li, Na, Rb or Cs. Here, the inorganic scintillation material is stoichiometric. This scintillation material has a very low nuclear background noise and therefore it can be used in particular as a scintillator detector in the field of nuclear medicine, physics, chemistry and oil research and for the detection of hazardous or illegal materials.

U.S. Pat. No. 7,084,403 B2 describes monocrystalline or polycrystalline scintillation materials containing an activator such as e.g. $Ce^{3+}$. The described scintillation material comprises lanthanum halogenides consisting either of a mixture of at least two halogenides, such as $LaCl_3$ and $LaBr_3$, or only of $LaI_3$. $LaI_3$ should essentially be free of $LaOI_2$. All materials are stoichiometric.

U.S. Pat. No. 7,067,816 B2 describes inorganic scintillation materials having a composition of $M_{1-x}Ce_xBr_3$, wherein M is selected from lanthanoids or lanthanoid mixtures of the group La, Gd and Y. X defines the molar ratio of M to cerium, wherein X is higher than 1% by mol and lower than 100% by mol. The scintillation material is stoichiometric. However, impurities which may occur during the production of the scintillation material may be present. These impurities are already present in the raw material in an amount of lower than 0.1% or even lower than 0.01%. These scintillation materials are used as detectors in industry and medicine or in the oil industry.

All scintillation materials known in prior art are stoichiometric. The term "stoichiometric" should mean the same as "in stoichiometric ratio", i.e. the ratio of anion to cation is stoichiometric. Deviations from the stoichiometry usually lead to an increased density of defects which results in deteriorated properties of the scintillation material.

SUMMARY OF THE INVENTION

It is the object of the present invention to provide a scintillation material which shows high mechanical resilience and good strength of the material. At the same time the requirements with respect to the above-mentioned properties have to be fulfilled.

According to the invention this object is attained by a single crystalline, polycrystalline or ceramic scintillation material, comprising one or more cation-forming elements and one or more anion-forming elements, characterized in that the cation-forming element is or all the cation-forming elements are present in the scintillator material in an amount which is greater than stoichiometric in relation to the one or more anion-forming elements that are present. The terms "hyper-stoichiometric" and "over-stoichiometric" are used herein synonymously.

Further embodiments of the present invention are described and claimed in the appended dependent claims.

It has surprisingly been found that a single crystalline, polycrystalline and ceramic scintillation material having improved strength can be provided when the cation-forming element is or the entirety of cation-forming elements are present in excess, which means an amount that is higher than the stoichiometric ratio. The stoichiometry results from the valence of the cation. For monovalent cations and anions in the sense of the invention a stoichiometric ratio is present, when the amount of the cation in the material is 50.000000% by mol. Analogously, a stoichiometric ratio of a bivalent cation is present, when the amount of these cations in the material is 33.333333% by mol. Accordingly, 25.000000% by mol is the value for trivalent cations.

In the sense of the invention, an amount that is higher than the stoichiometric ratio (hyper-stoichiometric or over-stoichiometric) means that the respective cations or the entirety of the respective cations are present in the scintillator material in an amount that is greater than the above-mentioned stoichiometric amount. Respective anions are under-represented. Even values of, for example, 50.000001% by mol, also 50.000010% by mol, as well as 50.000100% by mol 50.001000% by mol and 50.010000% by mol are over-stoichiometric or represent a value higher than the stoichiometric ratio for bivalent cations. Respective values are valid for trivalent cations and others.

In the phase diagram for a mixture of lanthanum metal and lanthanum chloride, which is shown in FIG. 1, solid lanthanum trihalogenide coexists with a liquid phase starting from the stoichiometric composition until a lanthanoid-rich eutectic mixture is reached. In the composition range starting from the stoichiometric composition of the lanthanoid trihalogenide at 25 mol % lanthanum, with respect to the entire material, until the composition of the eutectic mixture is reached, stoichiometric lanthanoid trihalogenides can be prepared in a lanthanoid-rich melt which has the composition in this range.

The composition of the scintillation material according to the present invention corresponds to the solidus composition of the respective compound according to the phase diagram, analogously to FIG. 1.

This solidus composition deviates from the stoichiometric composition, because for example it contains more lanthanoids and for example it contains less halogenides. The lanthanoid trihalogenides prepared for example in this way have an increased density of defects in the material. This for example results in the fact that lanthanoids or lanthoid cations which are present in excess are present at locations in the lattice which are primarily unoccupied.

As mentioned above, it is obvious from prior art that an increased density of defects results in a deterioration of the properties of the scintillation material. But now it has surprisingly been found that the properties of the scintillation material having an increased density of defects are not impaired. Further surprisingly, the increased density of defects does not result in disadvantages; on the contrary, the improved strength according to the present invention can be achieved. Thus for example lanthanoid trihalogenides with an excess of lanthanoids according to the present invention have improved mechanical resilience.

The starting materials used for the production of the scintillation material are known to be selected by a person skilled in the art so that they have a low content of daughter elements of uranium and thorium. For example the content of radioactive daughter elements in rare earth metal salts which originate from ionic ores from the south of China is lower than that of bastnaesite ores from the north of China and monazite from Australia. A lower content of daughter elements of uranium and thorium in the scintillation materials used results in lower background radiation and thus the signal-to-noise ratio is considerably improved.

The scintillation material according to the present invention comprises one or more cation-forming elements selected from the group consisting of La, Ce, Pr, Nd, Pm, Sn, Eu, Gd, Tb, Dy, Ho, Er, Tm, Yb and Lu, and one or more anion-forming elements selected from the group consisting of F, Cl, Br and I, characterized in that the cation-forming element or the cation-forming elements are present in an amount which is greater than 25% by mol and up to 32% by mol, with respect to a total amount of the scintillator material. Preferable are ranges of 27% by mol to 32% by mol, further preferable are 30% by mol to 32% by mol. Thus the lower limit is greater than 25% by mol, preferably higher than 27% by mol, further preferably greater than 30% by mol. The upper limit is a maximum of 32% by mol.

It is further in the sense of the invention that the scintillation material comprises one or more cation-forming elements selected from the group consisting of Sr, Ca and Ba, and one or more anion-forming elements selected from the group consisting of F, Cl, Br and I, wherein the cation-forming element is present in an amount which is higher than 33% by mol and up to 40% by mol, with respect to a total amount of the scintillator material. Further preferably in an amount of 34% by mol to 38% by mol, with respect to a total amount of the scintillator material. Thus the lower limit is higher than 33% by mol, preferably higher than 34% by mol, further preferably higher than 35% by mol. The upper limit is a maximum of 38% by mol and may also be 40% by mol.

The scintillation material according to the present invention may also comprise one or more cation-forming elements selected from the group consisting of Na, Li and K, and one or more anion-forming elements selected the group consisting of F, Cl, Br and I, wherein the cation-forming elements is or are present in an amount which is higher than 50% by mol and up to 60% by mol, with respect to a total amount of the scintillator material. Preferable are amounts of 51% by mol to 55% by mol, with respect to a total amount of the scintillator material. Thus the lower limit is higher than 50% by mol, preferably higher than 51% by mol, further preferably higher than 53% by mol. The upper limit is a maximum of 58% by mol and may also be 60% by mol.

In the case of the presence of at least two different cation-forming elements in the scintillation material according to the present invention one of the two different cation-forming elements is contained in a maximum amount of 20% by mol, preferably in a maximum amount of 10% my mol, with respect to a total amount of the scintillator material.

It is further preferred according to the present invention that in the case of the presence of at least two cation-forming elements in the scintillation material one of the at least two cation-forming elements is contained in an amount which is higher than 0.1% by mol, with respect to a total amount of the scintillator material. Preferred amounts for one of both cation-forming elements are 5 to 10% by mol, with respect to a total amount of the scintillator material, and particularly preferable is an amount of 0.1 to 6% by mol, wherein further preferable are amounts of 0.5% by mol to 6.0% by mol.

According to the present invention it is preferable that only two different cation-forming elements, namely lanthanum and cerium, and only one anion-forming element, namely chlorine as a chloride anion, are present in the material.

According to the present invention it is also preferable that only two different cation-forming elements, namely lutetium and cerium, and only one anion, namely iodine as an iodide anion, are present in the material.

According to a further embodiment of the invention only two different cation-forming elements, namely lutetium and europium, and only one anion-forming element, namely iodine as an iodide anion, are present in the material.

According to a further embodiment it is preferable that only two different cation-forming elements, namely lanthanum and cerium, and only one anion-forming element, namely bromine as a bromide anion, are present in the material. Preferably in this case the proportion of cerium is a maximum amount of 5% by mol. But optionally also only cerium as a cation-forming element and only one anion-forming element, namely bromine as a bromide anion, may be present in the material.

In addition, only two cation-forming elements, namely strontium and europium, and only one anion-forming element, namely iodine as an iodide anion, may be present in the material.

In a preferred composition according to the present invention of the scintillation material the at least one cation-forming element selected from the group consisting of La, Ce, Pr, Nd, Pm, Sm, Eu, Gd, Tb, Dy, Ho, Er, Tm, Yb and Lu, is present in an amount of 27% by mol to 32% by mol, with respect to a total amount of the scintillator material, further preferably in an amount of 30% by mol to 32% by mol, with respect to a total amount of the scintillator material.

In a preferred composition according to the present invention of the scintillation material the at least one cation-forming element is selected from the group consisting of Na, Li and K and is present in an amount of 51% by mol to 58% by mol, with respect to a total amount of the scintillator material, further preferably in an amount of 51% by mol to 55% by mol, with respect to a total amount of the scintillator material. Thus the lower limit is greater than 50% by mol, preferably greater than 51% by mol, further preferably greater than 53% by mol. The upper limit is a maximum amount of 58% by mol and may also be 60% by mol.

According to the present invention the scintillation materials are single crystalline, polycrystalline or ceramic material. Single crystalline scintillator material is preferred.

BRIEF DESCRIPTION OF THE DRAWING

FIG. 1 is a phase diagram for a mixture of $LaCl_3$ and lanthium metal.

EXAMPLE

This embodiment example is only for illustration and does not limit the scope of the patent claims.

The embodiment example is for production of a single crystal in which the one or more cation-forming elements is present in the scintillator material in an amount which is greater than stoichiometric in relation to the one or more anion-forming elements.

In a glove box which is operated with an argon atmosphere and in which the content of oxygen and hydrogen is lower than 5 ppm each 500 g of a water-free powder of stoichiometric $LaBr_3$ and 3.5 g of metallic lanthanum (La) together with 20 g of $CeBr_3$ as an activator are weighed and introduced into an ampoule of quartz glass having an inner diameter of 30 mm. At the bottom side of this ampoule a 4 cm long nucleation channel having an inner diameter of 5 mm is provided in which a seed crystal of stoichiometric $LaBr_3$ is located. The ampoule is evacuated, filled with argon having a purity of 6 N, evacuated again and sealed up.

The ampoule is put into a four (4) region Bridgman furnace in which the starting material and about 1 cm of the seed crystal are melted. The temperature in the hot region of the furnace is 950° C. and is maintained for about 12 hours.

Subsequently, a crystal is grown with a growth rate of 0.7 mm/h according to the Bridgman method. Thereafter the crystal is cooled to room temperature within 6 hours. The crystal produced in this way has no cracks and can be cut with a thread saw without bursting or cracking.

The term "cation-forming element" means any element that is present in the scintillator material, in part or in its entirety, in the form of cations.

The term "anion-forming element" means any element that is present in the scintillator material, in part or in its entirety, in the form of anions.

While the invention has been illustrated and described as embodied in scintillation materials in single crystalline, polycrystalline and ceramic form, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

We claim:

1. A single crystalline scintillation material, comprising:
    cations of the elements La and Ce and anions of the element Br, wherein the cations of Ce are present in amounts of up to 5% by mol, wherein the total amount of cations present in the material are higher than stoichiometric, in relation to the anions, and wherein the total amount of cations present in the material ranges from higher than 25% by mol up to 32% by mol, based on the total material.

2. The scintillation material according to claim 1, comprising:
    at least two cations, wherein the La cation is present in the material in an amount greater than 0.1% by mol up to a maximum of 20% by mol, based on the total material.

* * * * *